(12) United States Patent
Takekoshi

(10) Patent No.: US 8,101,436 B2
(45) Date of Patent: Jan. 24, 2012

(54) DICING METHOD, METHOD OF INSPECTING INTEGRATED CIRCUIT ELEMENT, SUBSTRATE HOLDING DEVICE, AND PRESSURE SENSITIVE ADHESIVE FILM

(75) Inventor: Kiyoshi Takekoshi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1258 days.

(21) Appl. No.: 10/492,530

(22) PCT Filed: Feb. 27, 2003

(86) PCT No.: PCT/JP03/02236
§ 371 (c)(1),
(2), (4) Date: Apr. 23, 2004

(87) PCT Pub. No.: WO03/075331
PCT Pub. Date: Sep. 12, 2003

(65) Prior Publication Data
US 2005/0003635 A1 Jan. 6, 2005

(30) Foreign Application Priority Data

Mar. 4, 2002 (JP) .................................. 2002-57772

(51) Int. Cl.
*G01R 31/26* (2006.01)
*H01L 21/66* (2006.01)
(52) U.S. Cl. .............. 438/18; 438/15; 438/17; 438/464; 257/E21.214
(58) Field of Classification Search .................... 438/15, 438/17, 18, 464, 465; 257/E21.214
See application file for complete search history.

(56) References Cited

U.S. PATENT DOCUMENTS

| | | | | |
|---|---|---|---|---|
| 3,399,332 | A * | 8/1968 | Savolainen | 257/746 |
| 3,512,027 | A * | 5/1970 | Kupsky | 313/499 |
| 3,842,491 | A * | 10/1974 | Depuy et al. | 438/14 |
| 4,635,092 | A * | 1/1987 | Yerman et al. | 257/677 |
| 4,716,124 | A * | 12/1987 | Yerman et al. | 438/15 |
| 5,114,292 | A * | 5/1992 | Geiser | 412/11 |
| 5,172,050 | A * | 12/1992 | Swapp | 324/762 |
| 5,177,439 | A * | 1/1993 | Liu et al. | 324/754 |
| 5,411,921 | A * | 5/1995 | Negoro | 438/118 |
| 5,476,566 | A | 12/1995 | Cavasin et al. | |
| 5,487,999 | A * | 1/1996 | Farnworth | 216/18 |

(Continued)

FOREIGN PATENT DOCUMENTS

EP   1 122 776   8/2001

(Continued)

*Primary Examiner* — Jarrett Stark
(74) *Attorney, Agent, or Firm* — Oblon, Spivak, McClelland, Maier & Neustadt, L.L.P.

(57) ABSTRACT

A dicing method, integrated circuit chip testing method, substrate holding apparatus, and adhesive film are disclosed. A first adhesive film 22 in which the adhesion is reduced by ultraviolet radiation is stretched inside a ring-like frame 21 larger than a wafer size, and a wafer W is adhered on the first adhesion film 22. A second adhesive film 4 in which the adhesion of the two surfaces is reduced by heating is adhered on a plate-like jig 3. After the first film is adhered on the second film, dicing is performed. Since the wafer is adhered to the jig, the relative positions of chips do not shift from each other. This makes it possible to load the wafer together with the jig into a testing apparatus and align electrode pads of the chips with a probe. This allows, e.g., collective testing of a plurality of chips.

8 Claims, 9 Drawing Sheets

U.S. PATENT DOCUMENTS

| | | |
|---|---|---|
| 5,534,102 A | 7/1996 | Kadono et al. |
| 6,017,776 A * | 1/2000 | Jiang et al. .................... 438/118 |
| 6,028,436 A * | 2/2000 | Akram et al. ................. 324/755 |
| 6,093,083 A * | 7/2000 | Lackey ........................... 451/28 |
| 6,200,833 B1 * | 3/2001 | Jiang et al. .................... 438/118 |
| 6,261,165 B1 * | 7/2001 | Lackey et al. ................. 451/387 |
| 6,294,439 B1 * | 9/2001 | Sasaki et al. ................. 438/464 |
| 6,312,977 B1 * | 11/2001 | Jiang et al. .................... 438/118 |
| 2002/0000650 A1 * | 1/2002 | Smith et al. ................... 257/692 |
| 2002/0197772 A1 * | 12/2002 | Jiang et al. .................... 438/118 |

FOREIGN PATENT DOCUMENTS

| | | |
|---|---|---|
| JP | 62-249446 | 10/1987 |
| JP | 1-125949 | 5/1989 |
| JP | 5-129431 | 5/1993 |
| JP | 5-343517 | 12/1993 |
| JP | 9-74076 | 3/1997 |
| JP | 2000-126959 | 5/2000 |
| JP | 2001-85364 | 3/2001 |
| WO | WO 02/19393 | 3/2002 |

* cited by examiner

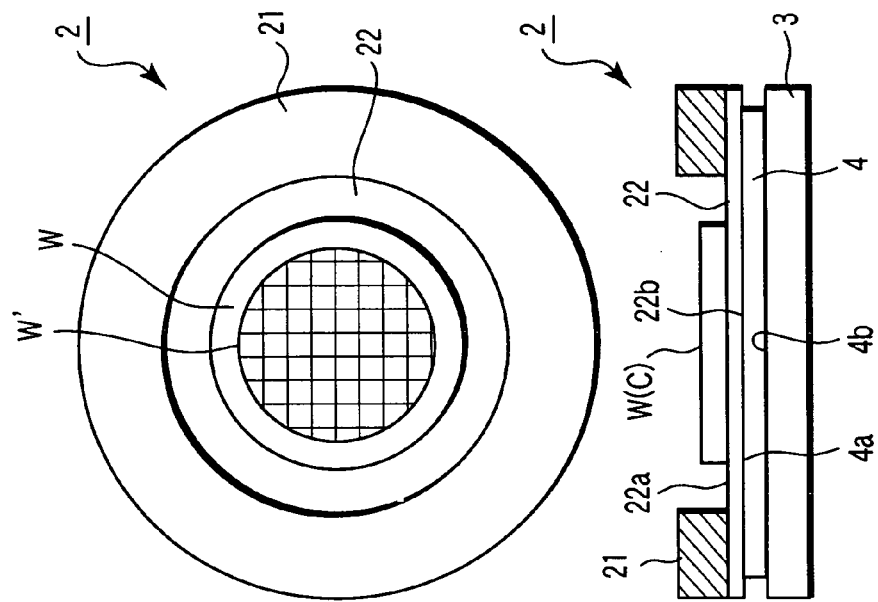
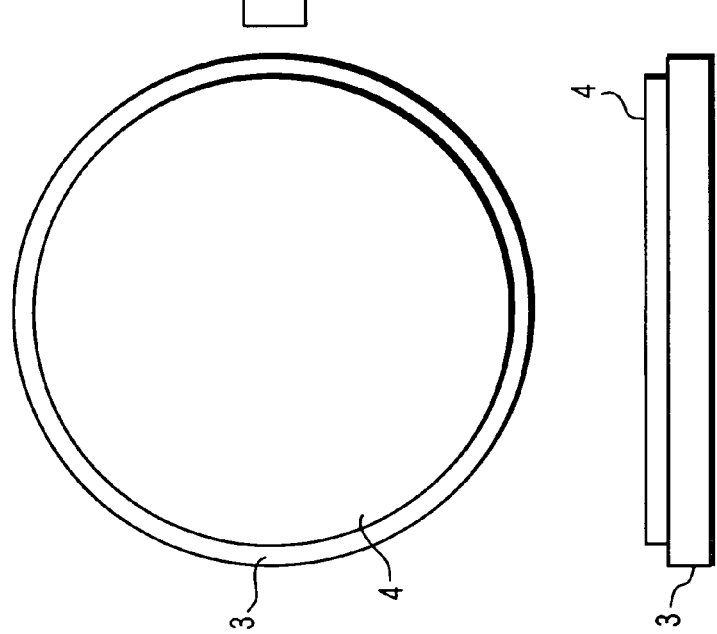
FIG. 3A
FIG. 3B

DICING METHOD, METHOD OF INSPECTING INTEGRATED CIRCUIT ELEMENT, SUBSTRATE HOLDING DEVICE, AND PRESSURE SENSITIVE ADHESIVE FILM

CROSS-REFERENCE TO RELATED DOCUMENTS

This document is a U.S. national phase under 35 U.S.C. §371 of International Application PCT JP03/02236 (not published in English) filed Feb. 27, 2003, the entire contents of which are hereby incorporated herein by reference.

TECHNICAL FIELD

The present invention relates to a method of dicing a semiconductor substrate on which a plurality of integrated circuit chips are arranged in a matrix, a method of testing the electrical characteristics of the diced integrated circuit chips, a substrate holding apparatus usable in these methods, and an adhesive film usable in the substrate holding apparatus.

BACKGROUND ART

A number of integrated circuit chips are arranged in a matrix on a semiconductor wafer (referred to as a "wafer" hereinafter) subjected to a series of fabrication processes. These elements are separated into individual elements by a conventional dicing method as shown in FIG. 13. That is, a holder 10 obtained by adhering an adhesive layer (e.g., an adhesive film 12 (e.g., 100 to 200 μm) having an adhesive upper surface 12a) to one surface of a ring-like frame 11 larger than the size of a wafer W is used. The holder 10 having the wafer W adhered to the adhesive surface 12a of the adhesive film 12 is placed on a chuck table 13. By moving a rotating blade 14 along scribe lines defining individual integrated circuit chips C, elements C are separated (for the sake of convenience, the integrated circuit chips and chips are denoted by the same reference symbol "C"). The holder 10 is unloaded from the chuck table 13. In positions corresponding to the individual chips C, the chips C are peeled one by one from the adhesive film 12 as they are pushed up from the lower surface of the adhesive film by a pushing means. A handling apparatus transports the peeled chips to the next step.

There are a case in which the electrical characteristics of the separated chips C are tested, and a case in which the chips C are directly mounted without attaching any lead frames. In these cases, the chips C are loaded one by one into a testing apparatus by the handling apparatus, and tested.

In the case in which the chips C separated from the wafer W are tested without attaching any lead frames, it is advantageous in respect of the efficiency of testing or the like to collectively (simultaneously) probe a plurality of chips C adhered to the adhesive film 12, i.e., a plurality of diced chips C. In the dicing step, however, a cutting blade 14 cuts into the middle of the adhesive film 12. In this state, the relative positions of the chips C shift from each other by a maximum of a few hundred μm, and this positional shift is irregular. This presumably occurs because the wafer W is adhered while tension is applied to the adhesive film 12, so a cut portion of the adhesive film 12 deforms since the portion is not supported by the wafer any longer.

For this reason, a plurality of diced chips cannot be collectively (simultaneously) probed.

Since this increases the total testing time or the like, the testing efficiency decreases. Also, the handling apparatus easily causes trouble when handling small chips of about 1.5 mm square.

The present invention has been developed under the circumstances described above. The present invention provides a dicing method and testing method capable of increasing the efficiency of testing of integrated circuit chips, and a substrate holding apparatus and adhesive film usable in these methods.

In addition, although a so-called double-coated tape is well known, no technique of extending its applications by giving a difference between the adhesion properties of the two surfaces is known.

DISCLOSURE OF INVENTION

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

According to a first aspect of the present invention, there is provided a dicing method of a semiconductor substrate on which a plurality of integrated circuit chips are arranged in a matrix. This dicing method comprises: adhering at least an entire region on the rear surface of the semiconductor substrate, which opposed a surface on which the integrated circuit chips are arranged, to a plate-like jig via at least one adhesive layer having adhesion properties (the adhesion of the adhesive layer is reduced when energy is applied to the adhesive layer); and separating the integrated circuit chips by cutting the semiconductor substrate by cutting means.

According to a second aspect of the present invention, there is provided a testing method of a plurality of integrated circuit chips formed on a semiconductor substrate. This testing method comprises: adhering the rear surface of the semiconductor substrate, which opposed a surface on which the plurality of integrated circuit chips are formed, on a plate-like jig by at least one adhesive layer formed over at least an entire region in which the integrated circuit chips are arranged; cutting the semiconductor substrate by cutting means to separate the plurality of integrated circuit chips into individual integrated circuit chips (the cut semiconductor substrate is adhered on the jig by the adhesive layer); aligning the semiconductor substrate adhered on the jig with a probe positioned in a space above the jig; and testing the electrical characteristics of the integrated circuit chips while the probe is in contact with electrode pads of the integrated circuit chips.

According to a third aspect of the present invention, there is provided a substrate holding apparatus for holding a semiconductor substrate on which a plurality of integrated circuit chips are arranged. This substrate holding apparatus comprises: a frame having a size larger than the semiconductor substrate; an adhesive film stretched on the frame, one surface of the adhesive film being a surface to which the rear surface of the semiconductor substrate is adhered; and a plate-like jig (the other surface of the adhesive film is adhered to the jig).

Each of the semiconductor substrate dicing method, integrated circuit chip testing method, and substrate holding apparatus provided in accordance with the first, second, and third aspects of the present application preferably comprises one of items (1) to (12) below, and more preferably comprises a combination of a plurality of items of (1) to (12).

(1) The at least one adhesive layer is an adhesive film having two adhesive surfaces.

(2) The two surfaces of the adhesive film are first and second surfaces, and energies to be applied to reduce the adhesion of the first and second surfaces are different in one of type and magnitude.

(3) The second surface of the adhesive film is on the jig side, the first surface of the adhesive film is on the semiconductor substrate side, and the energy to be applied to the second surface to reduce its adhesion is smaller than the energy to be applied to the first surface to reduce its adhesion.

(4) The adhesive layer has a laminated structure of first and second adhesive films (the first adhesive film is adhered to the semiconductor substrate, the adhesion of that surface of the first adhesive film, which is adhered to the semiconductor substrate, is reduced by the application of a predetermined energy, the second adhesive film is adhered to the jig, and the adhesion of the two surfaces of the second adhesive film is reduced by the application of energy different from the predetermined energy), and the first adhesive film is stretched inside a ring-like frame having a size larger than the semiconductor substrate.

(5) The integrated circuit chips are separated while the jig is placed on the chuck table.

(6) The adhesion of one surface of the adhesive film is reduced by heating, and the adhesion of the other surface of the adhesive film is reduced by ultraviolet radiation.

(7) The adhesion of that surface of the adhesive film, which faces the semiconductor substrate, is reduced by heating, and the adhesion of that surface of the adhesive film, which faces the jig, is reduced by ultraviolet radiation.

(8) The adhesion of the two surfaces of the adhesive film is reduced by ultraviolet radiation, and the wavelength of ultraviolet radiation which reduces the adhesion of one surface differs from that of ultraviolet radiation which reduces the adhesion of the other surface.

(9) The jig is made of a material which transmits ultraviolet radiation.

(10) The adhesion of the two surfaces of the adhesive film is reduced by heating, and a heating temperature for reducing the adhesion on the jig side is lower than a heating temperature for reducing the adhesion on the semiconductor substrate side.

(11) The adhesive film has a structure formed by laminating a first adhesive film which is adhered to the semiconductor substrate and wherein the adhesion of the surface adhered to the semiconductor substrate is reduced by ultraviolet radiation, and a second adhesive film which is adhered to the jig and wherein the adhesion of the two surfaces is reduced by heating.

(12) The adhesive film is stretched inside a ring-like frame having a size larger than the semiconductor substrate.

The integrated circuit chip testing method provided in accordance with the second aspect of the present invention preferably further comprises (13) or (14) below. This testing method preferably comprises a combination of (13) and (14).

(13) Applying first energy to the second surface of the adhesive film after the electrical characteristics of the integrated circuit chips are tested, and peeling the adhesive film from the jig; and applying second energy to the first surface of the adhesive film, and peeling the integrated circuit chips from the adhesive film.

(14) Peeling the first adhesive film from the second adhesive film by heating the jig after the electrical characteristics of the integrated circuit chips are tested, and peeling the integrated circuit chips from the first adhesive film by irradiating the first adhesive film with ultraviolet radiation, are performed in this order.

According to a fourth aspect of the present invention, there is provided a testing method of an integrated circuit chip. This testing method preferably comprises (15) to (17) below. The testing method preferably comprises a combination of any of (15) to (17).

(15) Fixing by suction to a chuck table the rear surface of a semiconductor substrate on which a plurality of integrated circuit chips are arranged, a suction surface of the chuck table including suction holes formed in positions corresponding to the positions of the integrated circuit chips, and a plurality of trenches formed in positions corresponding to scribe lines for separating the plurality of integrated circuit chips arranged on the semiconductor substrate into individual integrated circuit chips;

separating the plurality of integrated circuit elements into individual integrated circuit elements by cutting the semiconductor substrate by cutting means, the plurality of separated integrated circuit chips being fixed to the chuck table by suction;

aligning the semiconductor substrate fixed to the chuck table by suction with a probe positioned in a space above the chuck table; and testing the electrical characteristics of the integrated circuit chips while the probe is in contact with electrode pads of the integrated circuit chips.

(16) The rear surface of the semiconductor substrate on which the plurality of integrated circuit chips are arranged is fixed via a film to the chuck table by suction.

(17) In testing the electrical characteristics of the integrated circuit chips, the electrical characteristics of a plurality of integrated circuit chips are collectively tested while a probe is in contact with electrode pads of the plurality of integrated circuit chips at the same time.

BRIEF DESCRIPTION OF DRAWINGS

FIGS. 3A and 3B are views for explaining steps before a wafer is cut in the embodiment of the present invention;

BEST MODE FOR CARRYING OUT THE INVENTION

An embodiment of the present invention will be described below. This embodiment includes embodiments of a dicing method, substrate holding apparatus, and adhesive tape for integrated circuit chips of the present invention.

Figure 1A:
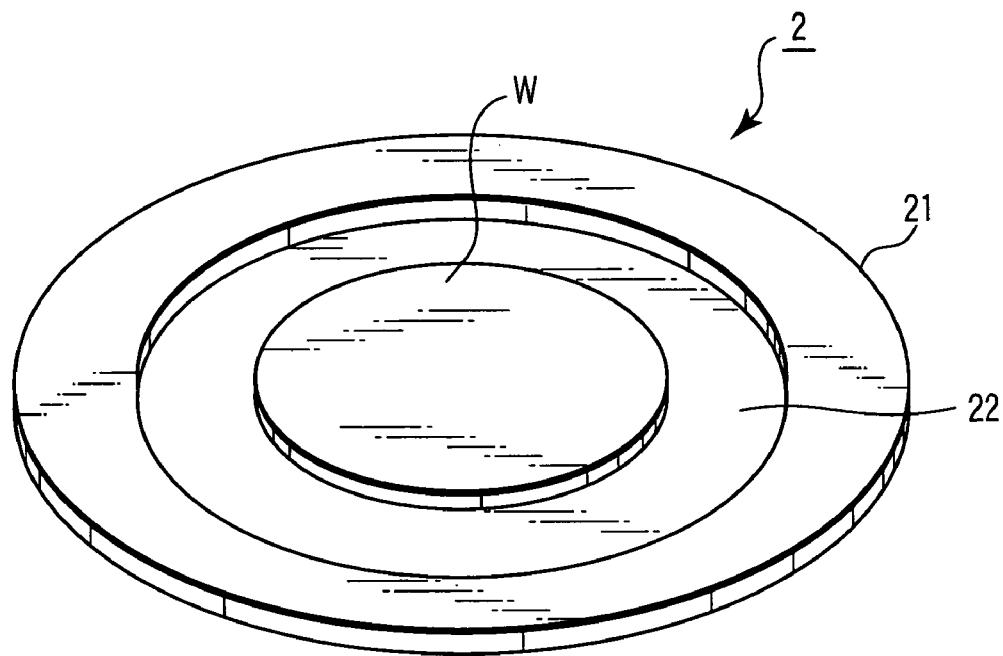
FIGS. 1A and 1B are views for explaining a wafer holder used in a method of the present invention.
Figure 1B:
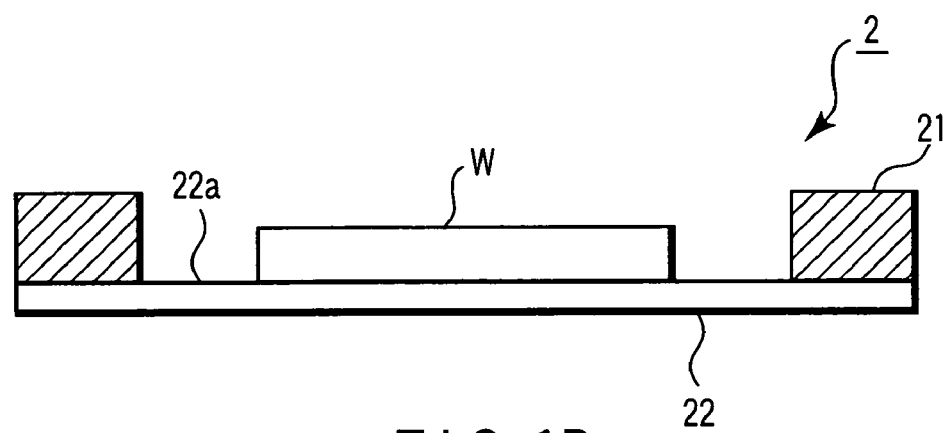

A substrate holding apparatus (to be referred to as a "holder" hereinafter) used in this embodiment will be described below with reference to FIGS. 1A and 1B. A holder 2 comprises a frame (e.g., a ring-like frame) 21 larger than the size of a wafer, and a first adhesive layer (e.g., a first adhesive film) 22 stretched on the frame 21. This adhesive film can have the same size as the outer circumference of the frame. The adhesion of one surface (first surface) 22a of the first adhesive film 22 is reduced by the application of energy (e.g., ultraviolet radiation). This surface is adhered to one surface of the frame 21 and stretched inside the frame 21.

The rear surface of a semiconductor substrate, e.g., a silicon substrate (to be referred to as a "wafer W" hereinafter) on which a number of integrated circuit chips are arranged in a matrix is adhered to a central portion of the holder 2 (strictly speaking, a central portion of the first adhesive film 22). By using the holder 2, an operator and a handling apparatus can transport the wafer W by holding the frame 21 of the holder 2.

Figure 2:
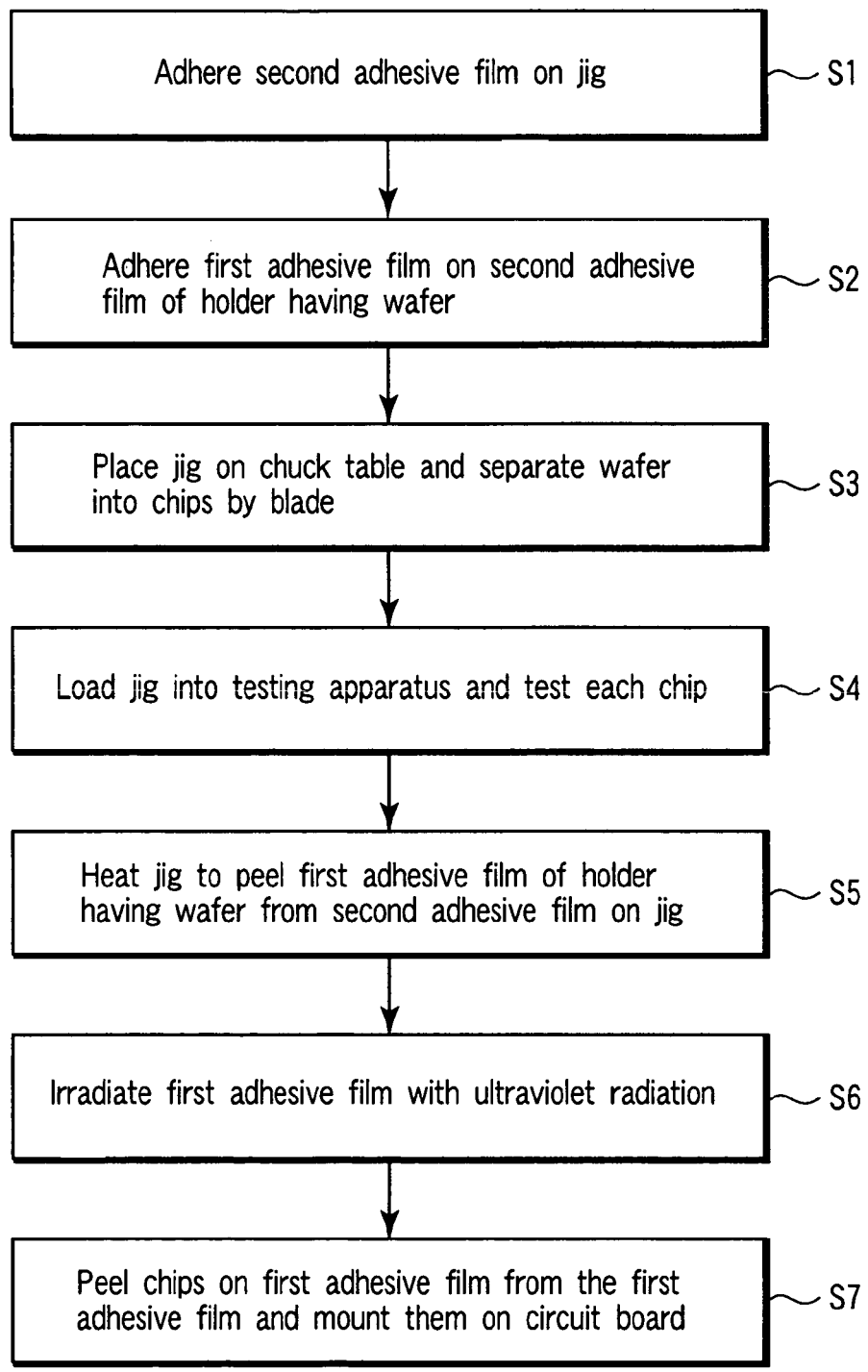
FIG. 2 is a flowchart showing an embodiment of the method of the present invention.

FIG. 2 is a flowchart showing the entire flow of a testing method according to this embodiment. As FIG. 3A shows, a fourth surface 4b of adhesive layers (e.g., a second adhesive film having adhesion properties) 4 on both the surfaces is adhered on a plate-like jig 3 (e.g., a circular plate having a thickness of about 1 mm and substantially the same size as the outer diameter of the frame 21) (step S1). The adhesion of the second adhesive film 4 is reduced by the application of energy (e.g., heat). As the material of the jig 3, it is preferable to use a material whose thermal expansion is close to or smaller than the thermal expansion of a silicon wafer. For example, it is possible to use Invar, aluminum nitride (AlN), silicon carbide (SiC), or silicon. The reason is to reduce positional shift between chips caused by thermal expansion of the chips when they are heated during testing.

As shown in FIG. 3B, a second surface 22b of the first adhesive film 22 stretched on the holder 2 having the wafer W is adhered to a third surface 4a of the second adhesive film 4 on the jig 3 (step S2). In this embodiment, the first adhesive film 22 and second adhesive film 4 form an adhesive layer for adhering the wafer W to the jig 3, and the thickness of each film is, e.g., 100 to 200 μm.

Figure 4:
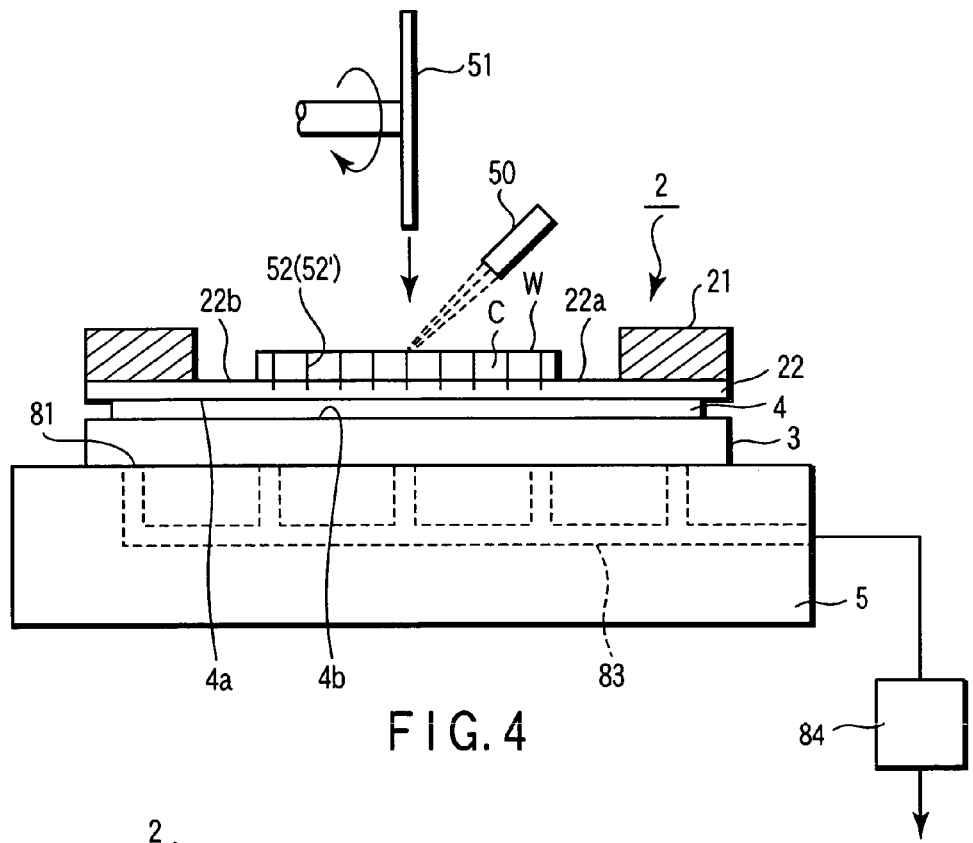
FIG. 4 is a view for explaining the way a wafer is cut in the embodiment of the present invention.
Figure 5:
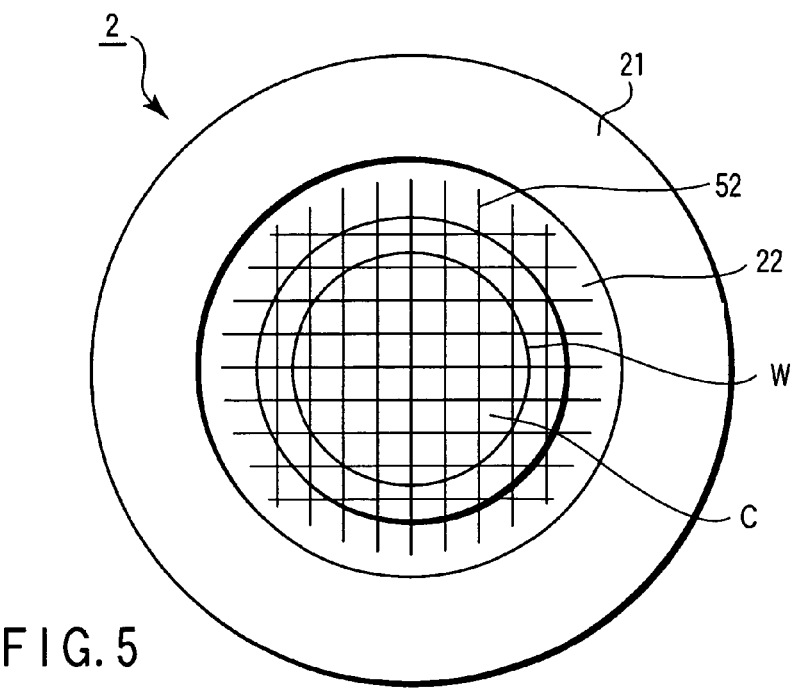
FIG. 5 is a plan view showing the state after the wafer held by the holder is cut into integrated circuit chips.

Subsequently, as shown in FIG. 4, the jig 3 having the wafer W is placed on a chuck table 5. The jig 3 is fixed to the chuck table 5 by suction by a vacuum drawing force which a suction pump 84 forms in suction holes 81 via a suction pipe 83. A rotating blade 51 as a cutting means (e.g., a cutting blade) moves along scribe lines 52' on the wafer W, and cuts the wafer W from cut lines 52. A plurality of integrated circuit chips C are separated into individual chips. While the blade 51 is cutting the wafer W, water can be supplied to the cut portion by a water supply means 50 or the like. The cut lines 52 may also extend to half the thickness the first adhesive film 22. The chuck table 5 can move in the X, Y, and Z directions, and can rotate around a vertical axis. After the blade 51 and wafer W are aligned, dicing can be performed by accurately moving the chuck table 5 relative to the rotating blade 51 (step S3). It is also possible to move the rotating blade 51 relative to the chuck table 5. Furthermore, another means such as a laser cutting means may also be used as the cutting means. FIG. 5 is a view showing the holder 2 having the diced wafer from above.

Figure 6:
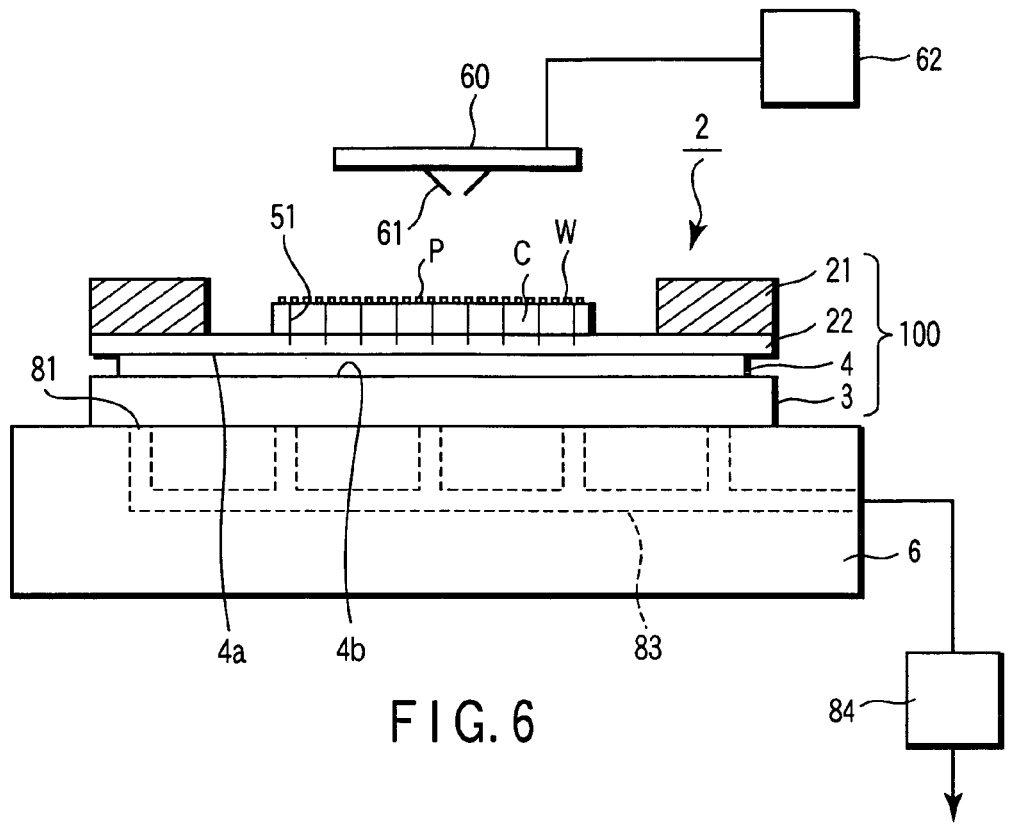
FIG. 6 is a view for explaining the way the integrated circuit chips on the wafer are tested by a testing apparatus in the embodiment of the present invention.

After that, the jig 3 is loaded into a testing apparatus (e.g., a prober), and placed on a chuck table 6 as shown in FIG. 6. The jig 3 is fixed to the chuck table 6 by suction from suction holes 81. By raising the chuck table 6, probes, e.g., probe needles 61 formed on a probe card 60 are brought into contact with electrode pads of the chips C. In this state, a tester 62 tests the electrical characteristics of each chip C. For example, it is possible to collectively bring the probe needles 61 into contact with a plurality of electrode pads of a plurality of chips C, and simultaneously test the electrical characteristics of the plurality of chips C (step S4). The tester 62 can apply a testing pulse to a plurality of chips C in turn. "Simultaneously test the electrical characteristics of a plurality of chips C" means that a plurality of probe needles 61 simultaneously come in contact with a plurality of electrode pads of a plurality of chips C. Therefore, a micro timing delay between the timings at which the testing pulse is applied to the probes 61 in turn is not a problem.

The chuck table 6 can move in the X, Y, and Z directions, and can rotate around a vertical axis. After the wafer W (the wafer W herein mentioned is an aggregate of the chips C to be exact) is aligned with the probe needles 61, the probe needles 61 are brought into contact with the electrode pads of the chips C in turn by, e.g., accurately moving the chuck table 6 intermittently. This alignment can be performed by, e.g., positioning the chuck table 6 such that a target mark on the wafer W is positioned in a predetermined position on the screen of a CCD camera.

Figure 7:
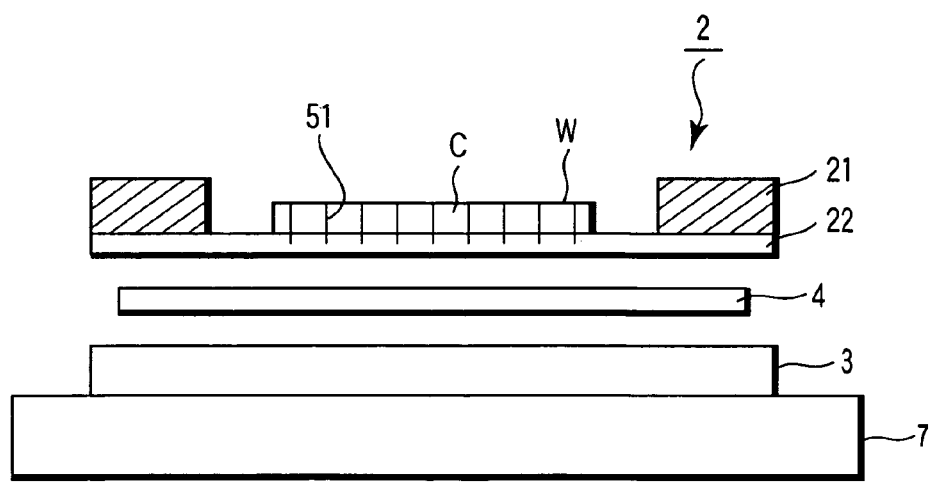
FIG. 7 is a view for explaining the way an adhesive film of the wafer holder is removed from a jig by heating the jig.

When testing of the electrical characteristics of the chips C is complete, the jig 3 is transported onto a heating means (e.g., a hot plate) 7 shown in FIG. 7, and heated to, e.g., about 120° C. This heating applies energy to the second adhesive film 4 to reduce its adhesion. As a consequence, the first adhesive film 22 can be easily peeled from the second adhesive film 4 (step S5). FIG. 7 shows the peeled state.

Figure 8:
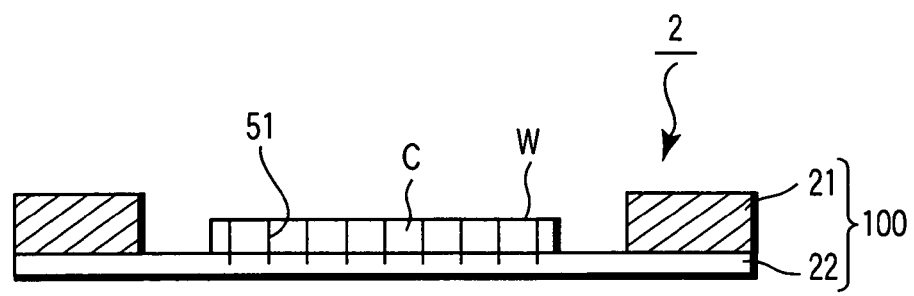
FIG. 8 is a view for explaining the way the adhesive film of the holder is irradiated with ultraviolet radiation so as to peel the wafer from the adhesive film in the embodiment of the present invention.
Figure 9:
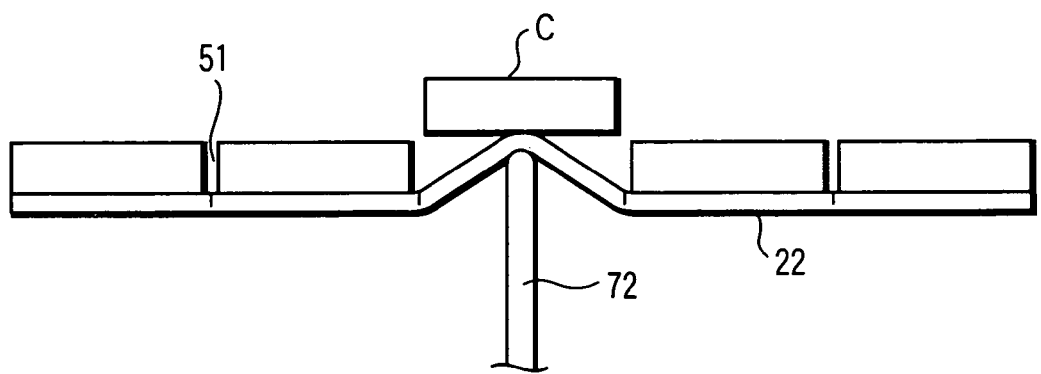
FIG. 9 is a view for explaining the way the integrated circuit chips are peeled from the adhesive film in the embodiment of the present invention.

As shown in FIG. 8, the second surface 22b of the first adhesive film 22 of the holder 2, which is peeled from the jig 3 is irradiated with ultraviolet radiation by, e.g., an ultraviolet radiating means 71. The first adhesive film 22 its adhesion is reduced by this application of the ultraviolet energy (step S6). Subsequently, as shown in FIG. 9, a chip peeling means peels the chips C on the first adhesive film 22. When a pushing means (e.g., a pushing pin 72) is used as the chip peeling means as shown in FIG. 9, the chip C is peeled from the first adhesive film 22 by pushing up the lower surface of that position of the first adhesive film 22, which corresponds to the chip C. A handling apparatus (not shown) handles the peeled chip C and mounts it on a circuit board. Although the chips C can be peeled one by one by pushing up and handled, it is also possible to simultaneously peel a plurality of chips C by pushing up and handle them.

In the embodiment described above, the wafer W is cut while the first adhesive film 22 of the holder 2 is adhered to the jig 3. As a result, even if the first adhesive film 22 is cut by the cutting means, the adhesive film 22 does not deform. The positions of the integrated circuit chips C remain the same as those before separation, so the relative positions of the chips C do not shift from each other. After that, while the chips C are adhered on the jig 3 via the first adhesive film 22, it is possible to align the probe needles 62 with the electrode pads of the chips C and test the electrical characteristics of the chips C in the testing apparatus. Since this increases the testing efficiency, the throughput increases, and this contributes to cost down. The effect is extremely large especially when a plurality of chips C are simultaneously tested. Furthermore, this eliminates the trouble in handling when the chips C are peeled one by one from the adhesive film 22 and tested.

The present invention also holds for a substrate holding apparatus and adhesive film for use in the dicing method and testing method as described above. A substrate holding apparatus 100 is equivalent to the structure made up of the frame 21, first adhesive film 22, second adhesive film 4, and jig 3 in the above embodiment.

Figure 10:
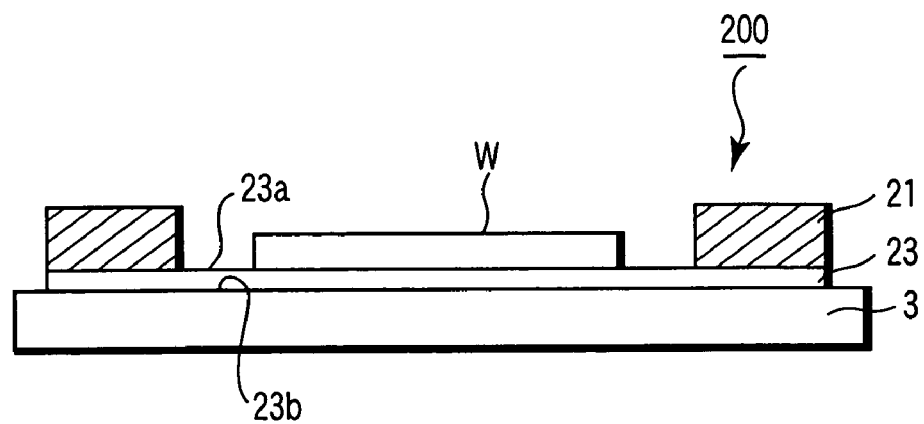
FIG. 10 is a side view showing a wafer holder used in another example of the embodiment of the present invention.

In the above embodiment, the first adhesive film 22 and second adhesive film 4 are used as an adhesive layer for adhering the wafer W to the jig 3. However, one double-coated adhesive film may also be used as this adhesive layer of the substrate holding apparatus. FIG. 10 shows this example. As a first adhesive film 23, energy to be applied to reduce the adhesion of a first surface 23a and energy to be applied to reduce the adhesion of a second surface 23b can be made different from each other in at least one of the type and magnitude. If the energy to be applied is heat, a temperature for reducing the adhesion of the first surface can be made different from a temperature for reducing the adhesion of the second surface. To make the types of energies to be applied different from each other, it is possible to use an adhesive film 23 having a first surface whose adhesion is reduced by ultraviolet radiation and a second surface whose adhesion is reduced by heating. In the latter case, a holder 200 can have a structure in which a wafer is adhered to the first surface and the jig 3 is adhered to the second surface. In the example shown in FIG. 10, a frame 21 is formed as in the embodiment described previously. However, by making the size of the jig 3 substantially equal to or slightly larger than the wafer W, it is possible to adhere the second surface 23b of the adhesive film 23 on the jig 3 and adhere the wafer W on the first surface 23a of the adhesive film 23. A substrate holding apparatus having this structure does not use the frame 21.

After testing, energy corresponding to the first surface 23a is applied to reduce the adhesion of the first surface. Each chip on the first surface of the adhesive film adhered to the jig 3 is peeled from the first surface. As this peeling method, it is possible to use various methods such as a vacuum or a manual operation. Heating can be used as the energy applying means. This example requires only one type of adhesive film, and facilitates the operation of setting the wafer W on the jig 3.

The adhesive film is preferably a film by which energy to be applied to one adhesive surface in order to reduce the adhesion is different from energy to be applied to the other adhesive surface. Alternatively, energy to be applied to an adhesive surface in order to reduce the adhesion to the jig is preferably smaller than energy to be applied to an adhesive surface in order to reduce the adhesion to the semiconductor substrate. The reason is as follows. The step of peeling a chip from the adhesive film is normally performed by pushing up the chip from the lower side of the adhesive film. If the adhesion of the first surface on the chip side is reduced when the adhesion of the second surface on the jig side is reduced in order to peel the adhesive film from the jig, chips may peel off and drop from the adhesive film. Therefore, it is preferable to reduce only the adhesion of the second surface of the adhesive film.

As this type of an adhesive film, it is possible to use an adhesive film by which the adhesion of each surface is reduced by ultraviolet radiation and the wavelength of ultraviolet radiation for reducing the adhesion of one surface differs from that of ultraviolet radiation for reducing the adhesion of the other surface, in addition to an adhesive film by which the adhesion of one surface is reduced by heating and the adhesion of the other surface is reduced by ultraviolet radiation. "REVALPHA" (trade name) manufactured by NITTO DENKO CORP. is known as an adhesive tape whose adhesion is reduced when a heating temperature is selected. Dicing tapes of "SP SERIES" (trade name) and "UC SERIES" (trade name) manufactured by Furukawa Electric Co., Ltd. and "ELEP HOLDER" (trade name) manufactured by NITTO DENKO CORP. are known as adhesive films whose adhesion is reduced when irradiated with ultraviolet radiation. When such an adhesive film is used, two types of ultraviolet radiating means having different wavelengths can be used. It is also possible to use an adhesive film by which the adhesion of each surface is reduced by heating and a heating temperature for reducing the adhesion of the first surface on the jig side is lower than a heating temperature for reducing the adhesion of the second surface on the semiconductor substrate side. In this case, the heating temperature of a heating means (e.g., a hot plate or an illuminating device for heating) for heating the adhesive film need only be changed. If the adhesion of the second surface on the jig side is reduced by ultraviolet radiation, an ultraviolet transmitting jig can be used. By emitting ultraviolet radiation from below the jig 3, the wafer W can be peeled from the jig 3. An adhesive film herein mentioned includes a film formed by laminating a plurality of adhesive films. Furthermore, an adhesive film or adhesive can also be used as the adhesive layer of the present invention.

Figure 11:
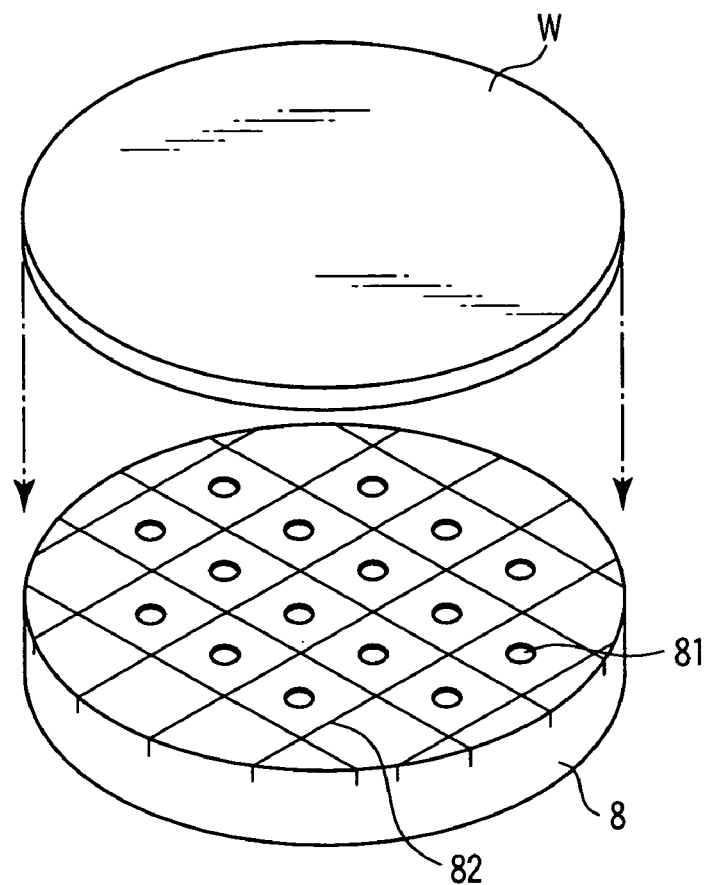
FIG. 11 is a perspective view showing a chuck table used in another embodiment of the present invention.
Figure 12:
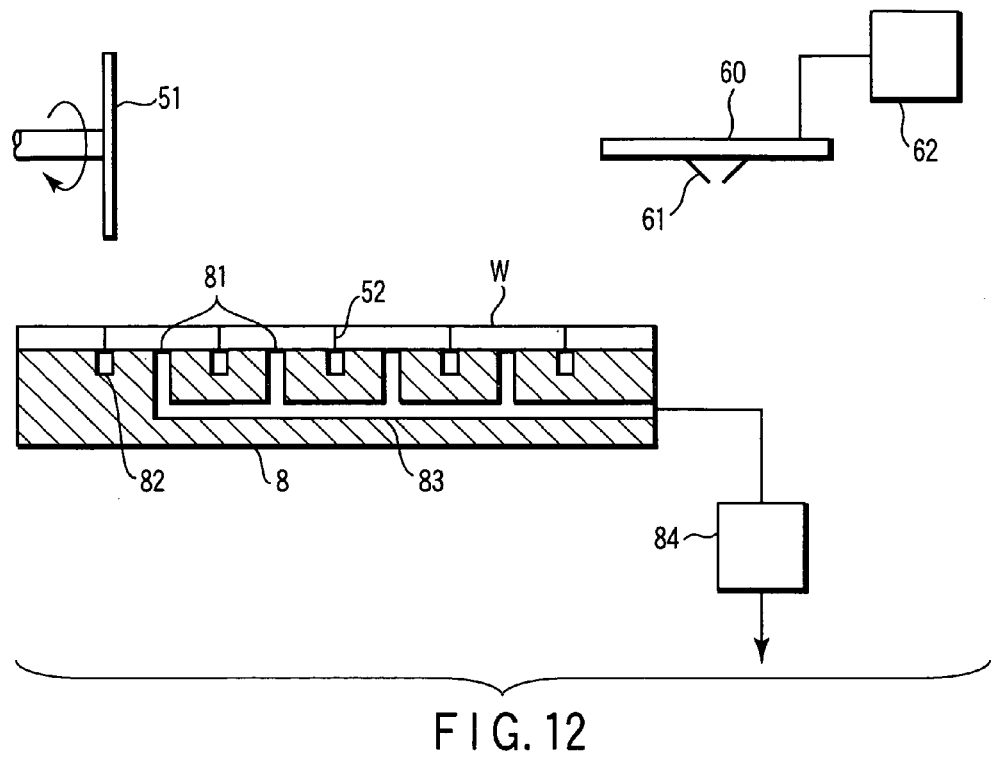
FIG. 12 is a view showing an outline of an apparatus used in the other embodiment of the present invention.
Figure 13:
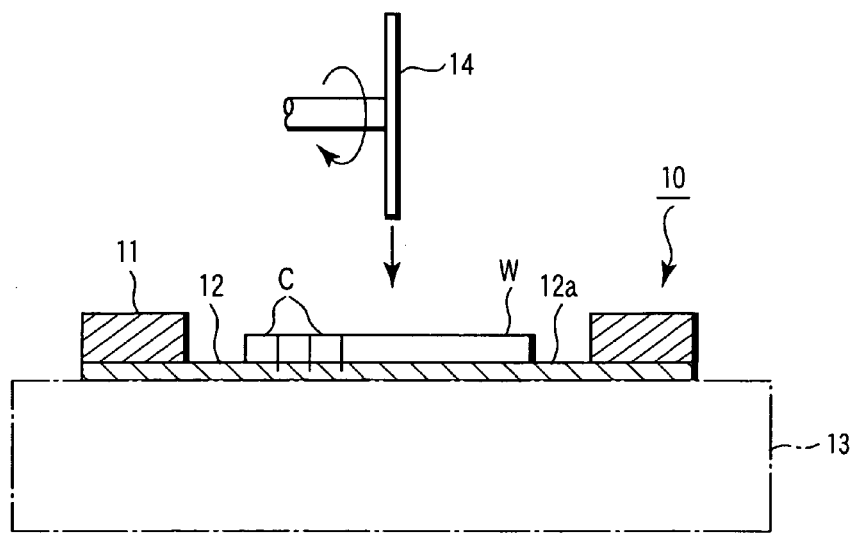
FIG. 13 is a view for explaining a conventional dicing method.

As a method of performing dicing of the present invention as described above, a chuck table 8 shown in FIGS. 11 and 12 can be used. The chuck table 8 has suction holes 81 formed in positions corresponding to a plurality of integrated circuit chips. The chuck table 8 can also have trenches 82 formed in portions corresponding to scribe lines between the integrated circuit chips. It is possible to place the wafer W on the chuck table 8, fix the wafer W by suction, and cut the wafer W along the scribe lines (i.e., along the trenches 82) by the blade 51, thereby dicing the wafer W. In this dicing, the blade 51 can cut into the trenches 82. In FIG. 12, reference numeral 83 denotes a suction path; and 84, a suction pump. In this example, the chuck table 8 on which the wafer W is diced and a plurality of chips are separated from each other is moved to a testing area. In this testing area, a tester checks the electrical characteristics of the chips via the probe needles 61.

Figure 14:
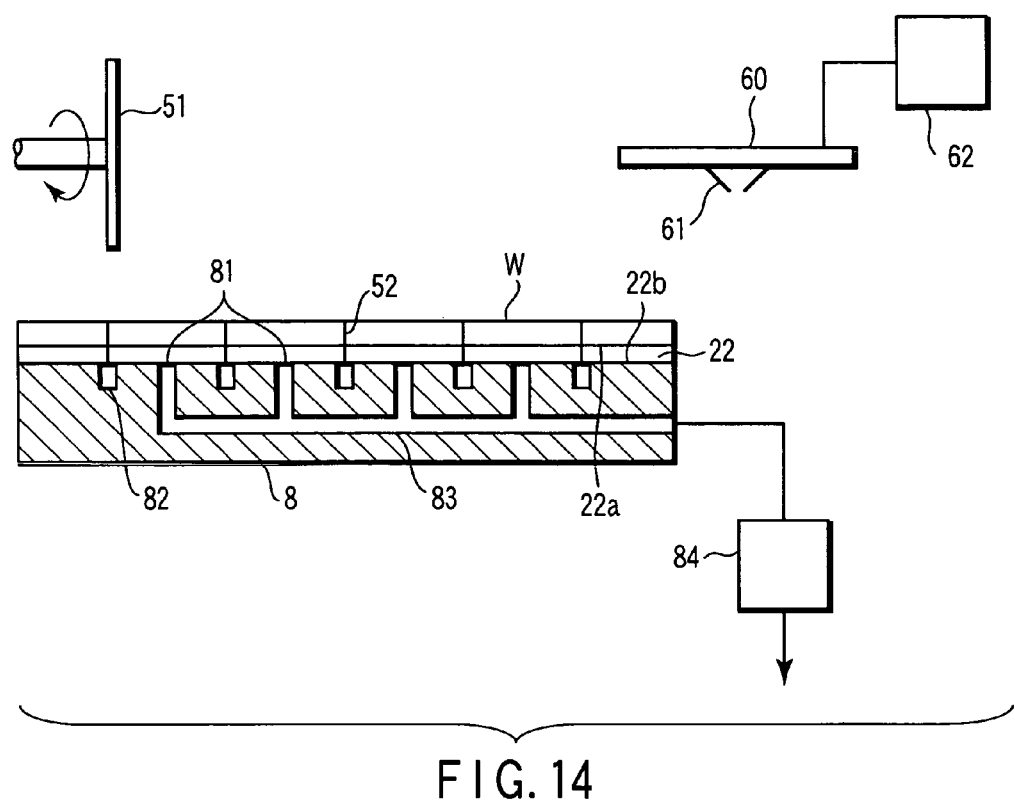
FIG. 14 is a view showing an outline of an apparatus used in another embodiment of the present invention.

In the method of fixing the wafer W to the chuck table by suction as described above, it is also possible, as shown in FIG. 14, to adhere a single-coated adhesive film whose adhesion is reduced by ultraviolet radiation or heat, such as the first adhesive film 22, to the rear surface of the wafer W, and fix this single-coated adhesive film to the chuck table by suction. In this case, the adhesive film is cut by the blade 51, so the trenches 82 are unnecessary.

In the embodiments of the present invention as described above, a semiconductor substrate is cut as it is adhered to a jig. Therefore, the relative positions of integrated circuit chips do not shift from each other during cutting. After that, the electrical characteristics of these integrated circuit chips can be tested in a testing apparatus while the chips are kept placed on the jig. This increases the testing efficiency. Since the substrate holding apparatus for holding the diced substrate to be loaded into the testing apparatus has a small, low-profile structure, a conventional testing apparatus for testing a substrate before dicing can be used by making few alterations to it.

Also, the adhesive film wherein the adhesion of each surface is reduced when applied with energy can be used in various applications in which it is effective to selectively use an adhesive state and non-adhesive state, as the adhesive film improves the operations of dicing and testing when used in the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit and scope of the general inventive concept as defined by the appended claims and their equivalents.

The invention claimed is:

1. A testing method of a plurality of integrated circuit chips formed on a semiconductor substrate, wherein the testing method comprises:
    adhering a rear surface of the semiconductor substrate, which opposes a surface on which the plurality of integrated circuit chips are formed, to a plate-shaped jig by at least one adhesive layer formed over at least an entire region in which integrated circuit elements are arranged;
    cutting the semiconductor substrate by cutting means to separate the plurality of integrated circuit elements into individual separated integrated circuit elements, the cut semiconductor substrate being adhered on the jig by the adhesive layer;
    aligning the semiconductor substrate adhered on the jig with a probe positioned in a space above the jig; and
    testing electrical characteristics of the separated integrated circuit elements while the probe is in contact with electrode pads of the separated integrated circuit elements;
    wherein the plate-shaped jig used in the testing method has a thermal expansion coefficient that is less than or substantially equal to a thermal expansion coefficient of the semiconductor substrate to reduce positional shift between the separated integrated circuit elements caused by heating of the separated integrated circuit elements during testing of the separated integrated circuit elements.

2. A testing method according to claim 1, wherein the at least one adhesive layer is an adhesive film having two adhesive surfaces.

3. A testing method according to claim 2, wherein the two surfaces of the adhesive film are first and second surfaces, and energies to be applied to reduce adhesion of the first and second surfaces are different in one of type and magnitude.

4. A testing method according to claim 3, wherein the second surface of the adhesive film is on a jig side, the first surface of the adhesive film is on a semiconductor substrate side, and the energy to be applied to the second surface to reduce the adhesion thereof is smaller than the energy to be applied to the first surface to reduce the adhesion thereof.

5. A testing method according to claim 3, further comprising:
    applying first energy to the second surface of the adhesive film after the electrical characteristics of the separated integrated circuit elements are tested, and peeling the adhesive film from the jig; and
    applying second energy to the first surface of the adhesive film, and peeling the separated integrated circuit elements from the adhesive film.

6. A testing method according to claim 5, wherein
    the adhesive layer is formed by laminating a first adhesive film which is adhered to the semiconductor substrate, and wherein adhesion of a surface adhered to the semiconductor substrate is reduced by application of a predetermined energy, and a second adhesive film which is adhered to the jig, and wherein adhesion of two surfaces is reduced by application of energy different from the predetermined energy, and
    the first adhesive film is stretched inside a ring-shaped frame having a size larger than the semiconductor substrate.

7. A testing method of an integrated circuit chip, wherein the testing method comprises:
    fixing by suction to a chuck table a rear surface of a semiconductor substrate by suction on which a plurality of integrated circuit elements are arranged, a suction surface of the chuck table including suction holes formed in positions corresponding to positions of the integrated circuit elements, the semiconductor substrate being fixed to the chuck table by vacuum sucking force at the suction holes, and the chuck table having a plurality of trenches formed in positions corresponding to scribe lines for separating the plurality of integrated circuit elements arranged on the semiconductor substrate into individual integrated circuit elements, the semiconductor substrate diced along the scribe lines;
    separating the plurality of integrated circuit elements into individual separated integrated circuit elements by cutting the semiconductor substrate by cutting means, the plurality of separated integrated circuit elements being fixed to the chuck table by suction;
    aligning the semiconductor substrate fixed to the chuck table by suction with a probe positioned in a space above the chuck table; and
    testing electrical characteristics of the separated integrated circuit elements while the probe is in contact with electrode pads of the separated integrated circuit elements.

8. A testing method according to claim 7, wherein the fixing the rear surface of the semiconductor substrate to the chuck table by suction includes fixing the rear surface of the semiconductor substrate, on a surface of which the plurality of integrated circuit elements are arranged, to the chuck table by suction via an adhesive film, the adhesive film being adhered and fixed to the chuck table even after the semiconductor substrate is cut.

* * * * *